United States Patent [19]
Nagata

[11] Patent Number: 6,043,872
[45] Date of Patent: Mar. 28, 2000

[54] METHOD AND APPARATUS FOR DETERMINING DEFECTIVENESS/NON-DEFECTIVENESS OF A SEMICONDUCTOR LASER BY EXAMINING AN OPTICAL OUTPUT FROM THE SEMICONDUCTOR LASER

[75] Inventor: Yoshiko Nagata, Tokyo, Japan

[73] Assignee: NEC Corporation, Tokyo, Japan

[21] Appl. No.: 08/494,570

[22] Filed: Jun. 22, 1995

[30] Foreign Application Priority Data

Jun. 22, 1994 [JP] Japan .................................. 6-139243

[51] Int. Cl.⁷ ....................................................... G01J 1/00
[52] U.S. Cl. ........................ 356/121; 372/29; 324/158.1
[58] Field of Search .................................. 356/121, 213, 356/218; 372/29, 31, 38; 324/765, 767; 250/205

[56] References Cited

U.S. PATENT DOCUMENTS

| | | | |
|---|---|---|---|
| 4,062,632 | 12/1977 | Dixon | 356/72 |
| 4,106,096 | 8/1978 | Paoli | 364/481 |
| 4,604,753 | 8/1986 | Sawai | 372/36 |
| 4,680,810 | 7/1987 | Swartz | 455/609 |
| 4,684,883 | 8/1987 | Ackerman et al. | 356/121 |
| 4,795,976 | 1/1989 | Pawlik | 324/158 D |
| 4,827,116 | 5/1989 | Takagi et al. | 250/205 |

FOREIGN PATENT DOCUMENTS

2186234 7/1990 Japan .
3227093 10/1991 Japan .

Primary Examiner—Hoa Q. Pham
Attorney, Agent, or Firm—Sughrue, Mion, Zinn, Macpeak & Seas, PLLC

[57] ABSTRACT

A driving current is supplied to a semiconductor laser and an optical output from the semiconductor laser is measured by an optical output measuring circuit. The measured optical output is differentiated with respect to said driving current and a first characteristic data indicative of a relation of the differentiated optical output and the driving current is calculated by a first differentiating circuit. The calculated first characteristic data is differentiated with respect to the driving current and a second characteristic data indicative of a relation of the secondary differentiated optical output and said driving current is calculated. The calculated second characteristic data is converted into a determination code. The converted determination code is compared with a pre-registered code for determining the defectiveness/non-defectiveness of a semiconductor laser and it is determined based on the comparing result the defectiveness or non-defectiveness of the semiconductor laser.

20 Claims, 11 Drawing Sheets

METHOD AND APPARATUS FOR DETERMINING DEFECTIVENESS/NON-DEFECTIVENESS OF A SEMICONDUCTOR LASER BY EXAMINING AN OPTICAL OUTPUT FROM THE SEMICONDUCTOR LASER

BACKGROUND OF THE INVENTION

1. Field of the invention

The present invention relates to a method and apparatus for determining the defectiveness or non-defectiveness of a semiconductor laser, by automatically detecting a presence or absence of an abrupt bent portion so-called kink appearing in a waveform which is indicative of a change of differentiated optical output, which is obtained by differentiating an optical output from a defective semiconductor laser with respect to a driving current.

2. Description of the Related Art

Figure 1A:
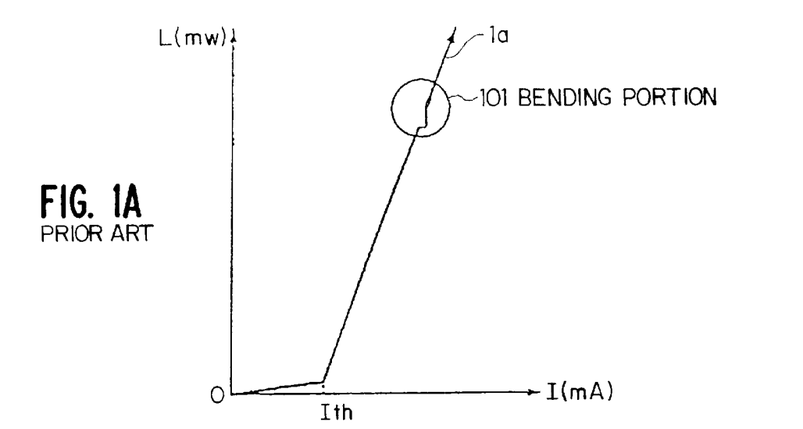
FIG. 1A is a waveform diagram which provides an example of a typical optical output characteristic (I–L characteristic) of a semiconductor laser for the change of a driving current.

A conventional method of determining the defectiveness or non-defectiveness of a semiconductor laser will be described below with reference to FIG. 1A to FIG. 1C.

A semiconductor laser starts light emission when a driving current (I) being gradually increased reaches a threshold current Ith of the driving current (I), as shown in a waveform 1a of FIG. 1 that is indicative of the change in the optical output (L) characteristic (to be referred to as I–L characteristic hereinafter) due to a change in the driving current (I). After the driving current (I) supplied to the semiconductor laser becomes greater than the threshold current Ith, the optical output (L) from the semiconductor laser is substantially proportional to the supplied driving current (I). Referring to the waveform 1a indicative of the I–L characteristic shown in FIG. 1A, it is determined that this semiconductor laser is defective because a bending portion 101 exists in a part of the waveform. In order to detect easily and accurately the bending portion 101 appearing in the waveform indicative of the I–L characteristic, the optical output (L) is differentiated with respect to the driving current (I) by a differentiating circuit. The optical output (L) is differentiated with respect to the driving current (I), dL/dI, and the result is designated as a differentiated optical output characteristic which reflects a change in the driving current (to be referred to as a differentiated I–L characteristic hereinafter). The waveform 1b indicative of the differentiated I–L characteristic is shown in FIG. 1B. The bending portion 101 present in the waveform 1a indicative of the I–L characteristic appears distinguishably in the waveform 1b indicative of the differentiated I–L characteristic as a concave portion or protrusion portion 1c of the waveform 1b or as a discontinuous point which is due to the combination of these portions (to be referred to a kink 1c). Referring to the waveform 1b indicative of the differentiated I–L characteristic shown in FIG. 1B, a semiconductor laser whose waveform 1b includes a kink 1c is determined to be defective. That is, if the defectiveness or non-defectiveness of a semiconductor laser is determined based on the waveform 1b indicative of the differentiated I–L characteristic, the determination can be carried out more easily, as compared to the simple determination based on the waveform 1a indicative of the I–L characteristic.

Figure 2:
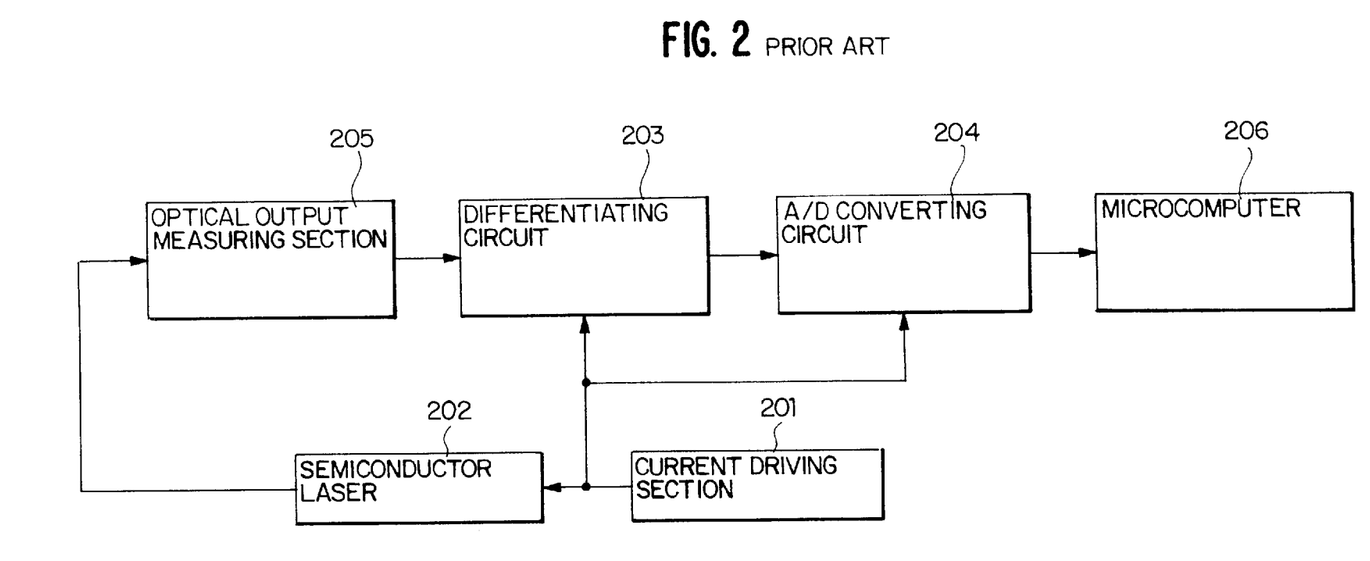
FIG. 2 is a block diagram showing the structure of a conventional apparatus for determining the defectiveness or non-defectiveness of a semiconductor laser.

The conventional method of determining the defectiveness or non-defectiveness of a semiconductor laser using the waveform indicative of the differentiated I–L characteristic will be described with reference to FIG. 2. Such a method is described in, for example, Japanese Laid Open Patent disclosures Hei. 2-186234 and Hei. 3-227093.

A driving current (I) is generated in a current driving section 201 and supplied to a semiconductor laser 202, a differentiating circuit 203, and an A/D converting circuit 204. The semiconductor laser 202 outputs a laser light in accordance with the magnitude of the driving current (I). An optical output (L) of the laser light is converted into an electric signal by an optical output measuring circuit 205 and supplied to the differentiating circuit 203. In the differentiating circuit 203, differentiated I–L characteristic data indicative of a change in an amount of the optical output (L) in response to a change in the driving current (I) are calculated based on the driving current (I) supplied from the current driving section 201 and the optical output supplied from the optical output measuring circuit 205. In other words, the optical output (L) is differentiated with respect to the driving current (I) in the differentiating circuit 203. Further, in the A/D converting circuit 204, the differentiated I–L characteristic data and the driving current (I) are A/D converted and sent to a microcomputer 206.

Figure 1B:
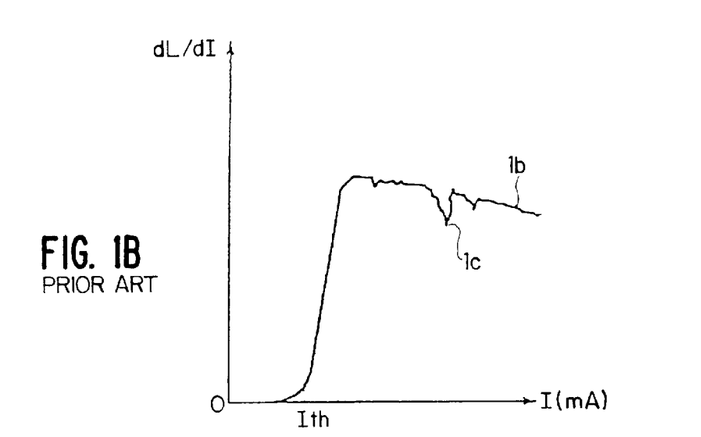
FIG. 1B is a waveform diagram which provides an example of the typical differentiated optical output characteristic (differentiated I–L characteristic) of a semiconductor laser for the change of the driving current.
Figure 1C:
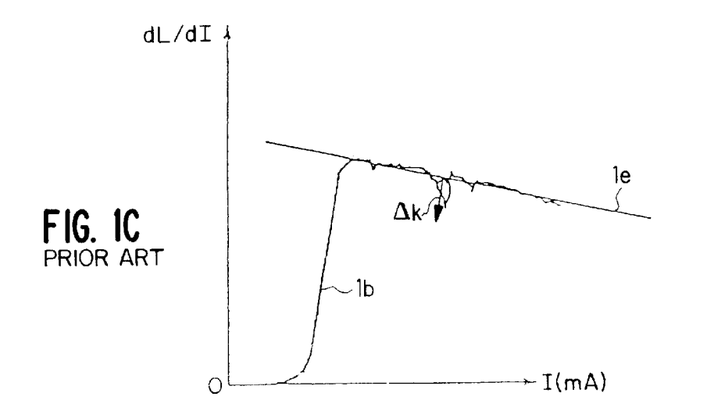
FIG. 1C is a diagram which aids in understanding a conventional method of determining the defectiveness or non-defectiveness of a semiconductor laser.

The microcomputer 206 detects a point where a waveform indicative of the differentiated I–L characteristic, for example, the waveform 1b shown in FIG. 1B, rises abruptly, that is, a point where the supplied driving current (I) reaches a threshold current Ith, and estimates a line 1e (see FIG. 1C) using the point as a start point. Then, as shown in FIG. 1C, the microcomputer 206 compares the estimated line 1e with a portion of the waveform 1b indicative of the differentiated I–L characteristic in which portion the supplied driving current (I) is greater than the threshold current Ith and calculates a maximum value ΔK of a distance between the estimated line and the portion of the waveform 1b. The maximum value ΔK is compared with a present determination reference value. In a case that the maximum value ΔK is greater than the reference value, it is determined that a kink 1c is present in the waveform 1b indicative of the differentiated I–L characteristic. As a result, the semiconductor laser 202 is determined to be defective. On the other hand, if the maximum value ΔK is smaller than the reference value, it is determined that the semiconductor laser 202 is non-defective.

However, in the conventional method of determining the defectiveness or non-defectiveness of a semiconductor laser, it was impossible to detect any kink present in the vicinity of the threshold current Ith in the waveform indicative of the differentiated I–L characteristic. The semiconductor lasers can be classified into two major groups, a Fabry-Perot laser and a distributed feedback laser (to be referred to as a DFB laser). The Fabry-Perot laser oscillates in a multiaxes mode, and exhibits a plurality of wavelength components in a single optical pulse signal. On the contrary, the DFB laser is a single mode laser. Therefore, it is necessary to determine the defectiveness or non-defectiveness of a semiconductor laser based on the detection of any kink in the optical output characteristic in a wide range of the driving current (I) including a region in the vicinity of the threshold current Ith. Thus, whether or not a DFB laser is non-defective could not be determined with a high precision by the conventional method to determine the defectiveness of non-defectiveness of a semiconductor laser.

Figure 5A:
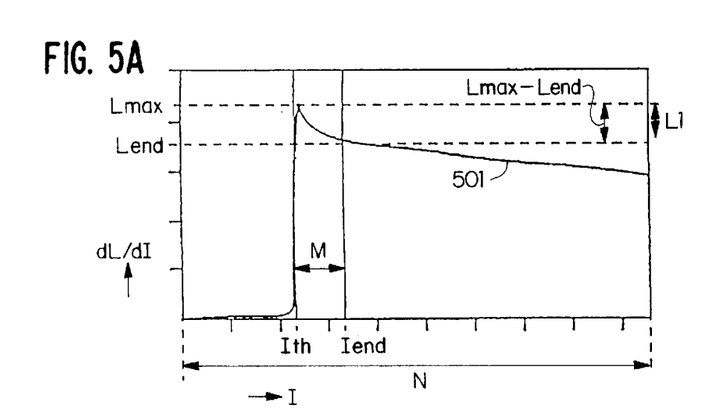
FIGS. 5A to 5D are waveform diagrams which provide examples of the differentiated I–L characteristic data of semiconductor lasers which aid in understanding the operation of the embodiment of the present invention.
Figure 5B:
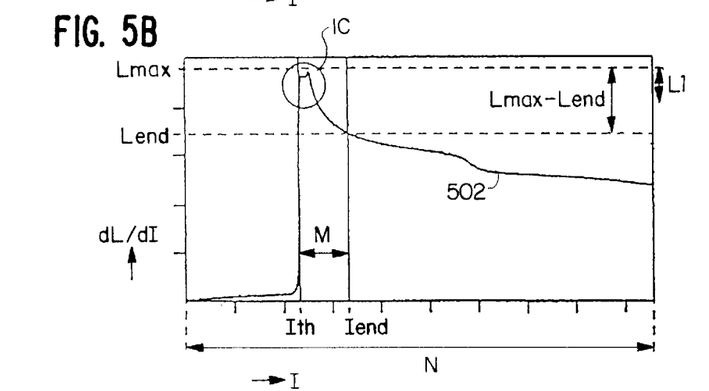
Figure 5C:
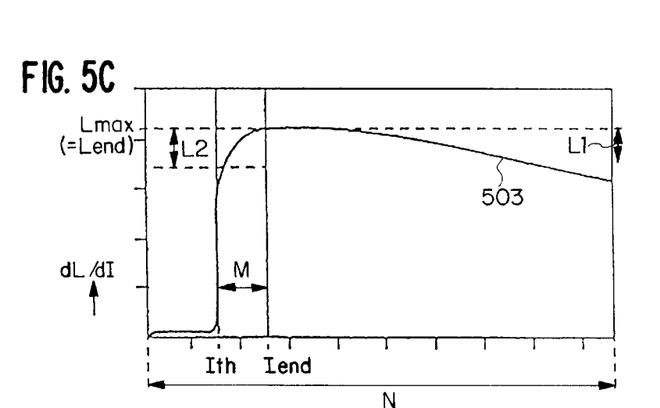

In DFB lasers which exhibit a non-defective characteristic, there is a case in which the waveforms indicative of the differentiated I–L characteristic are different from each other because of different settings of various parameters such as k (optical coupling coefficient)×L (element resonator length), the height of a diffraction lattice, and differences between various characteristics for every wafer included in the semiconductor laser (see FIGS. 5A and 5C). Even if the different settings and above-mentioned differences are reduced to a minimum level, the waveform indicative of the differentiated I–L characteristic arbitrarily changes depending upon the shape of a diffraction lattice on the oscillation end surface of a semiconductor laser. Therefore, it is very difficult to control the waveform. Thus, in a case in which such a semiconductor laser is being tested for defectiveness or non-defectiveness, it is impossible to determine the defectiveness or non-defectiveness of the semiconductor laser based on the distance between the waveform indicative of a differentiated I–L characteristic and the estimated line. As a result, there is a lack of reliability associated with the determination of the defectiveness or non-defectiveness of a semiconductor laser.

Accordingly, using the conventional method, it is impossible to automatically determine the defectiveness or non-defectiveness of every type of semiconductor laser using numerical data of the waveform indicative of the optical output from the semiconductor laser. Therefore, in many cases, a worker looks at the waveform indicative of the differentiated I–L characteristic of a semiconductor laser to determine the defectiveness or non-defectiveness of the semiconductor laser. Accordingly, the criteria to determine the defectiveness or non-defectiveness of a semiconductor laser is different from one worker to another, resulting in an increased chance of producing low quality data from the semiconductor laser.

SUMMARY OF THE INVENTION

An object of the present invention is to provide a method and apparatus for automatically determining the defectiveness or non-defectiveness of a semiconductor laser based on data obtained from the optical output from the semiconductor laser.

Another object of the present invention is to provide a method and apparatus for determining the defectiveness or non-defectiveness of a semiconductor laser by automatically detecting a kink even if it is difficult to locate a point where the kink appears on the waveform indicative of the differentiated I–L characteristic of the semiconductor laser.

Still another object of the present invention is to provide a method and apparatus for determining the defectiveness or non-defectiveness of a semiconductor laser by automatically detecting a kink which appears in the vicinity of a threshold current value on the waveform indicative of the differentiated I–L characteristic.

Yet still another object of the present invention to provide a method and apparatus for determining the defectiveness or non-defectiveness of a semiconductor laser even if the same type of semiconductor lasers show a plurality of different waveforms indicative of the differentiated I–L characteristic.

In order to achieve the above objects, a method and apparatus for determining the defectiveness or non-defectiveness of a semiconductor laser is provided according to the present invention. Specifically, a driving current is supplied to a semiconductor laser and an optical output from the semiconductor laser is measured by a measuring section. Next, the measured optical output is differentiated with respect to the driving current supplied to the semiconductor laser and a first characteristic data indicative of a relation of the differentiated optical output and the driving current is calculated by a first data calculating section. The first characteristic data is further differentiated with respect to the driving current and a second characteristic data indicative of a relation of the secondary differentiated optical output and the driving current is calculated by a second data calculating section. The second characteristic data is converted into a determination code by a converting section and the determination code is compared with a preregistered code for determining the defectiveness or non-defectiveness of a semiconductor laser by a comparing section. In this manner, by determining the defectiveness or non-defectiveness of a semiconductor laser based on the comparing result, it is possible to automatically detect a kink appearing in the waveform indicative of the differentiated I–L characteristic with a high degree of precision. Therefore, the determination of the defectiveness or non-defectiveness of a semiconductor laser can be automatically carried out with a high precision.

As a further refinement, according to the method and apparatus for determining the defectiveness or non-defectiveness of a semiconductor laser of the present invention, a type of waveform can be determined based on the shape of the waveform, the waveform being formed from the first characteristic data which is calculated by a first data calculating section and obtained while the driving current is increased by a predetermined value from a threshold value, the determination of the defectiveness or non-defectiveness of a semiconductor laser is made possible even if the semiconductor lasers are of the same type but have a plurality of different waveforms of the differentiated I–L characteristic.

Furthermore, the method of determining the defectiveness or non-defectiveness of a semiconductor laser according to the present invention includes a section for determining whether or not noise is sufficiently removed from the second characteristic data. In addition, according to the present invention, there is also provided process steps for smoothing the first characteristic data and converting the smoothed first characteristic data into the second characteristic data. These steps are repeated until it is determined that the noise is sufficiently removed from the second characteristic data. In this manner, it is possible to effectively convert the second differentiated optical output into the determination code. As a result, the determination of defectiveness or non-defectiveness of a semiconductor laser can be carried out with a high degree of precision.

BRIEF DESCRIPTION OF THE DRAWING

The above and other objects, features, and advantages of this invention will become more apparent from the following detailed description taken with the accompanying drawings, in which.

DESCRIPTION OF PREFERRED EMBODIMENT

The preferred embodiments of the present invention will be described with reference to the drawings.

Figure 3:
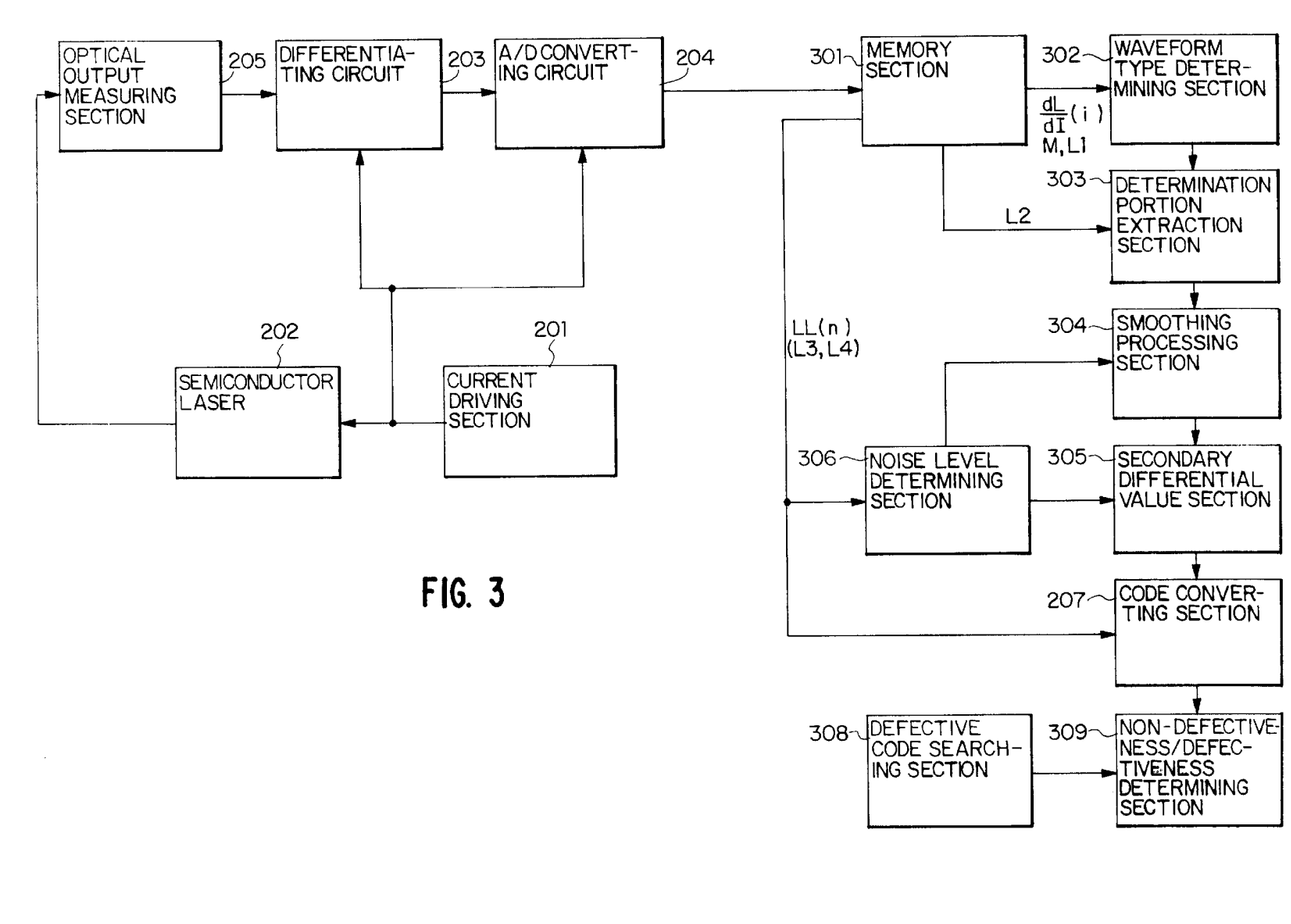
FIG. 3 is a block diagram showing the structure of an embodiment of the present invention.
Figure 4:
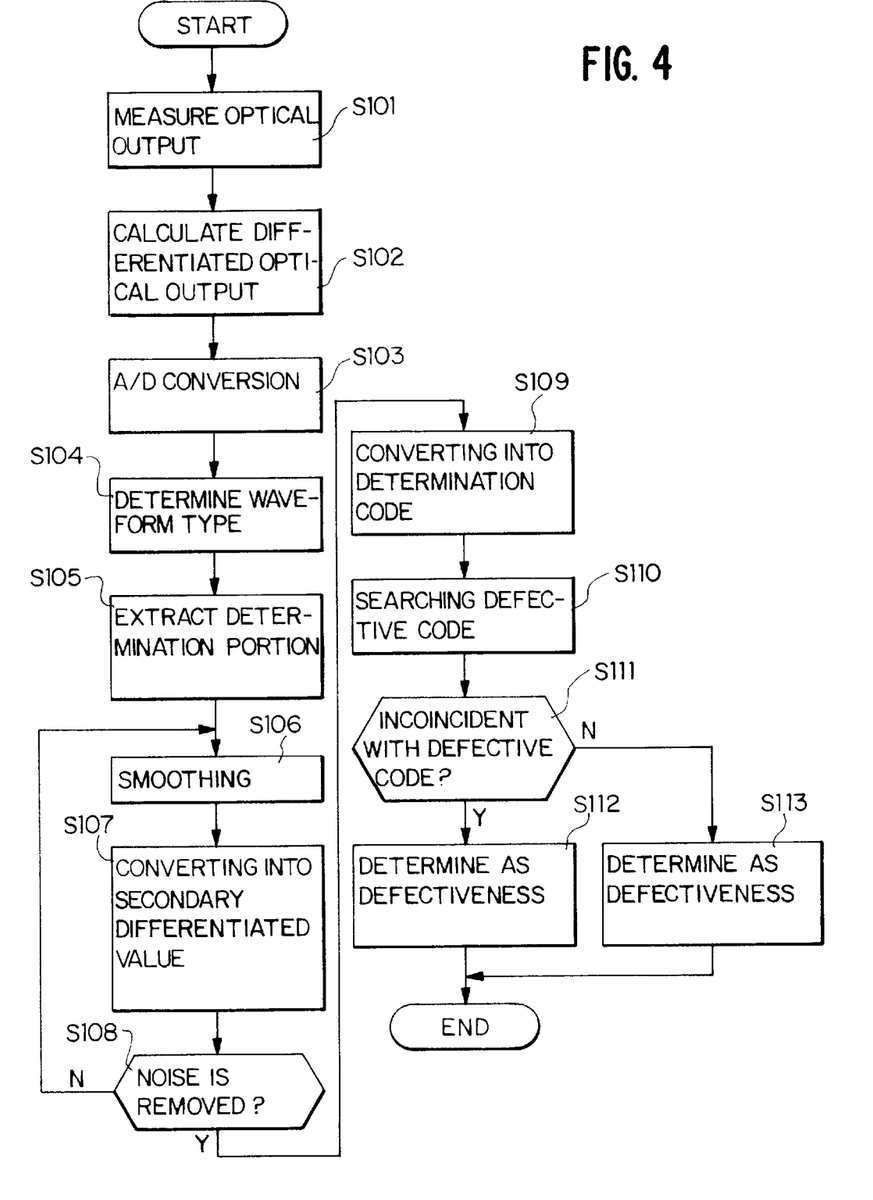
FIG. 4 is a flow chart for explaining the operation of the embodiment of the present invention.
Figure 5D:
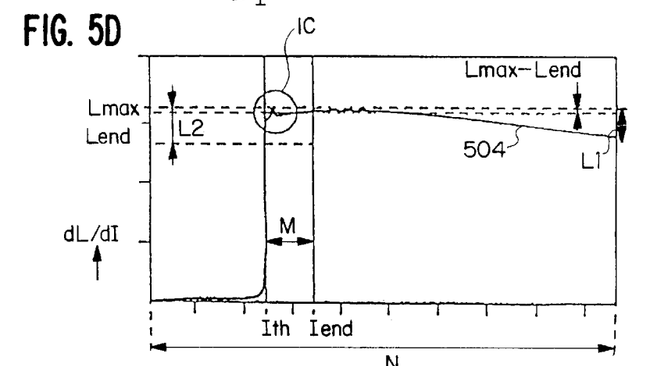

Referring to FIGS. 3 and 4, an optical output measuring circuit 205 measures an optical output (L) of a semiconductor laser 202 for a driving current (I) supplied to the semiconductor laser 202 (S101). The driving current (I) and optical output (L), as measured by the optical output measuring circuit 205, are provided to a differentiating circuit 203 such that the optical output (L) is differentiated with respect to the driving current (I). As a result, driving current (I)—differentiated optical output (dL/dI) characteristic data (differentiated I–L characteristic data) can be calculated (S102). The differentiated I–L characteristic data indicates a change in an amount of the optical output (L) for a change in the driving current (I). An A/D converting circuit 204 converts the driving current (I) supplied to the semiconductor laser 202 and the differentiated I–L characteristic data calculated by the differentiating circuit 203 into digital data (S103). This A/D-converted differentiated I–L characteristic data dL/dI [i] (i=0, 1, ..., N) are stored in a memory section 301. Examples of the A/D-converted differentiated I–L characteristic data dL/dI [i] are shown in FIGS. 5A to 5D. In these figures, the abscissas indicate a value i (i=1, 2, ..., N) corresponding to the driving current (I) and the ordinate indicate a value dL/dI [i] corresponding to the differentiated optical output [dL/dI]. Next, a waveform type determining section 302 classifies the waveform showing the differentiated I–L characteristic data dL/dI [i] which is stored in the memory section 301 into a type X in which a portion of each of the waveforms is lower than a threshold current Ith and protrudes downward as shown in FIGS. 5A and 5B and a type Y in which a portion of each waveform lower than the threshold current Ith protrudes upward as shown in FIGS. 5C and 5D (S104). In this manner, by classifying the waveform showing the differentiated I–L characteristic data into the type X and type Y, the type of the semiconductor laser 202 can be determined.

Figure 6:
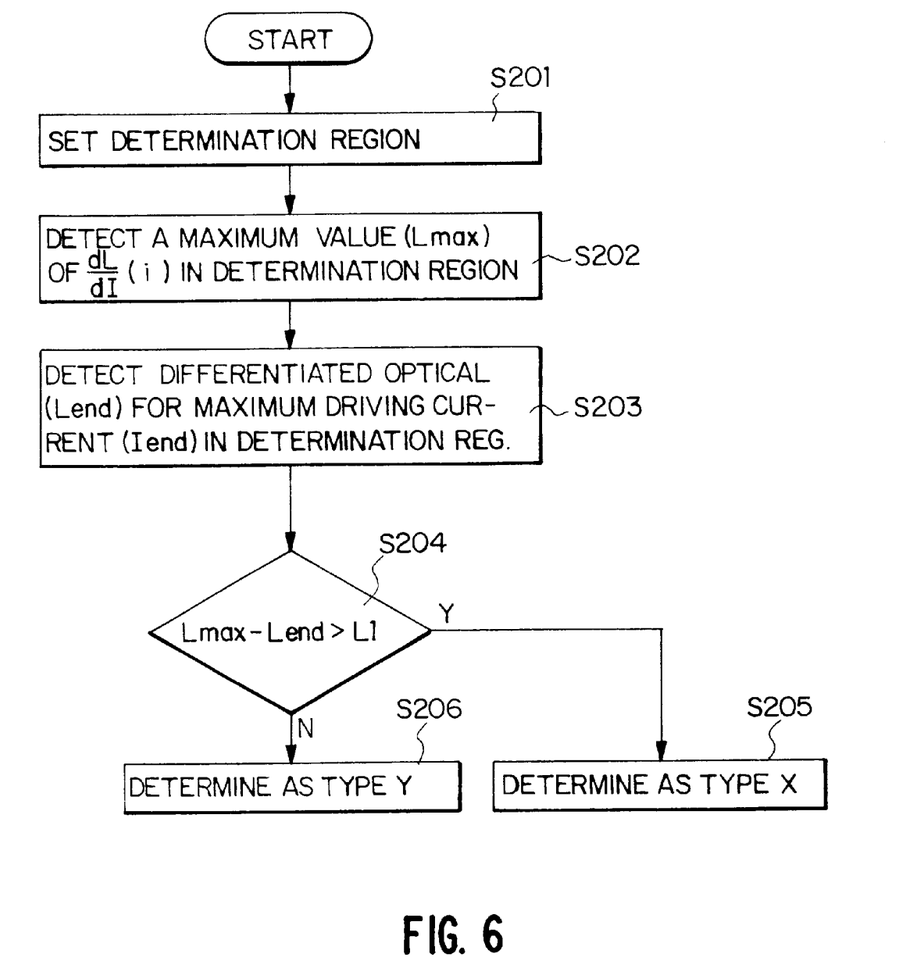
FIG. 6 is a flow charge which aids in understanding the operation of the waveform type determining section shown in FIG. 3.

A procedure by which the type of each waveform indicating the differentiated I–L characteristic data is determined will be described in detail with reference to the flow chart shown in FIG. 6.

First, a region is chosen as a determination target region which is used to classify the type of waveform showing the differentiated I–L characteristic data dL/dI [i] which is stored in the memory section 301 (S201). The determination target region is a region where the driving current (I) changes from the threshold current value (Ith) to a region end current value (Iend), as shown in FIG. 5A. The region end current value (Iend) is equal to the threshold current value (Ith)+M, where M is determined based on sample data obtained using non-defective semiconductor lasers and defective semiconductor lasers as references and an optimal value of M is stored in the memory section 301 in advance. Next, a maximum value (Lmax) of a differentiated optical output value is detected from the differentiated I–L characteristic data dL/dI [i] in the set determination target region (S202). Further, a differentiated optical output value (Lend=dL/dI [Iend]) for the region end current value (Iend) which may be a maximum value of the driving current (I) in the determination target region is detected (S203). The detected Lmax and Lend are compared with each other to determine a difference between Lmax and Lend, and the waveform of the differentiated I–L characteristic data dL/dI [i] is classified into the type X or type Y based on whether the difference is greater than a predetermined threshold value L1 or not (S204). More specifically, if Lmax−Lend >L1, the waveform of the differentiated I–L characteristic data dL/dI [i] is determined to be the type X (S205), whereas if Lmax−Lend ≦Li, the waveform of it is determined to be the type Y (S206). The threshold value L1 is determined based on sample data obtained from the non-defective semiconductor lasers and the defective semiconductor lasers which are employed as the references and an optimal value of L1 is stored in memory section 301 in advance.

Referring to FIGS. 3 and 4 again, a determination portion extracting section 303 extracts a waveform data to be used for determination of a non-defectiveness or defectiveness of the semiconductor laser 202 from among the differentiated I–L characteristic data dL/dI [i] stored in the memory section 301 in accordance with the type of the waveform determined by the waveform type determining section 302 (S105).

The procedure according to an embodiment of the present invention by which the waveform data is extracted to determine the non-defectiveness or defectiveness of the semiconductor laser 202 based on the differentiated I–L characteristic data dL/dI [i] will be described below in detail with reference to FIGS. 7A and 7B.

Figure 7A:
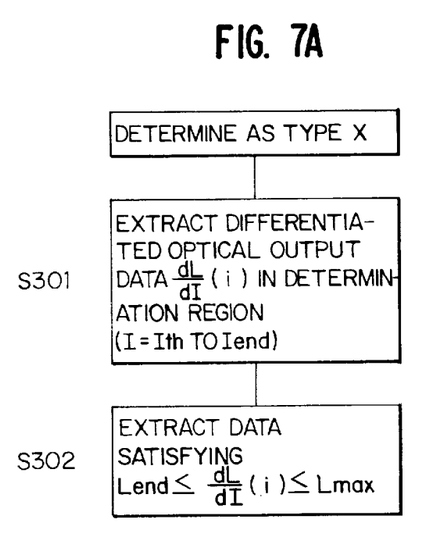
FIGS. 7A and 7B are flow charts which aid in understanding the operation of the determination portion extracting section shown in FIG. 3.
Figure 8A:
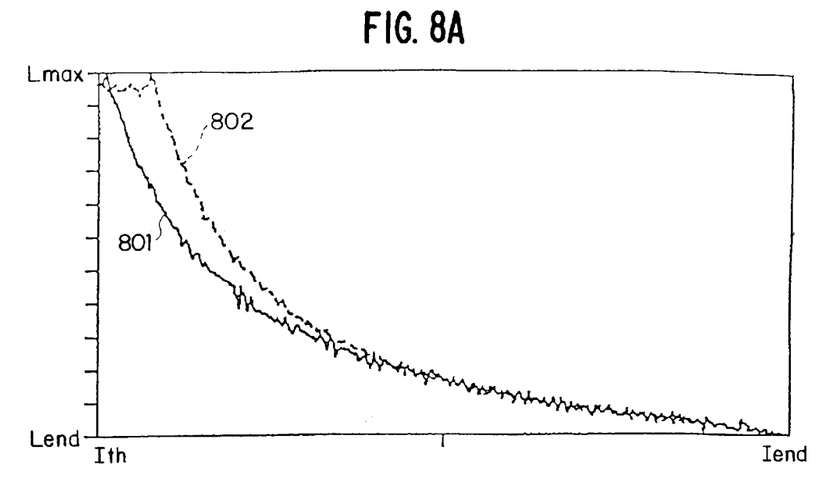
FIGS. 8A and 8B are waveform diagrams indicative of the differentiated I–L characteristic data of a semiconductor laser extracted by the determination portion extracting section shown in FIG. 3.

Referring to FIG. 7A, if it is determined by the waveform type determining section 302 that the type of the waveform indicative of the differentiated I–L characteristic data dL/dI [i] is the type X, the differentiated I–L characteristic data dL/dI [i] contained in the region from the threshold current (Ith) to the region end current (Iend) is the first extracted (S301). Further, a portion is extracted from the extracted differentiated I–L characteristic data dL/dI [i] to satisfy Lend≦dL/dI [i] ≦Lmax (S302). This finally extracted differentiated I–L characteristic data dL/dI [i] is used to determine the defectiveness or non-defectiveness of the semiconductor laser 202. The waveform 801 shown in FIG. 8A shows a data extracted from the differentiated I–L characteristic data dL/dI [i] shown by the waveform 501 of FIG. 5A by the determination portion extracting section 303. The waveform 802 of the FIG. 8A shows a data extracted from the differentiated I–L characteristic data dL/dI [i] shown by the waveform 502 of FIG. 5B by the determination portion extracting section 303.

Figure 7B:
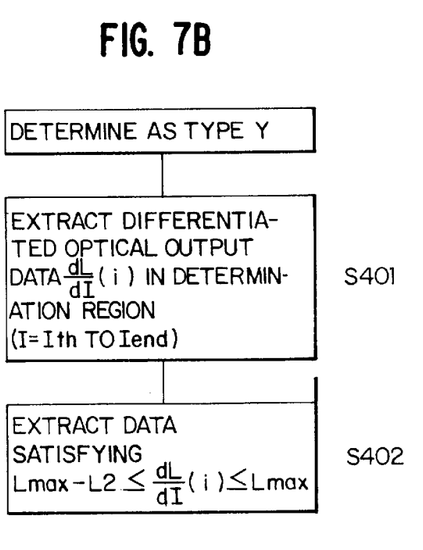
Figure 8B:
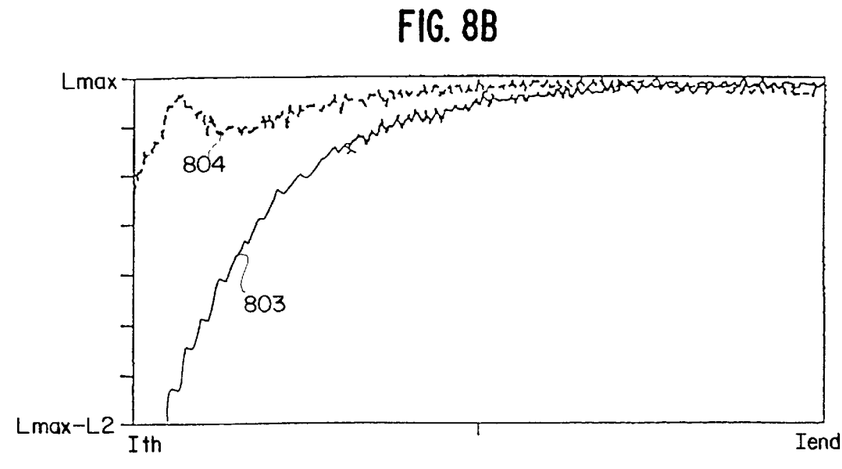

On the other hand, referring to FIG. 7B, if it is determined by the waveform type determining section 302 that the type of the differentiated I–L characteristic data dL/dI [i] is the type Y, the differentiated I–L characteristic data dL/dI [i] contained in the region from the threshold current (Ith) to the above region end current (Iend) is extracted (S401). Further, a portion is extracted from the extracted differentiated I–L characteristic data dL/dI [i] to satisfy Lmax–L2 ≦dL/dI [i] ≦Lmax (S402). This finally extracted differentiated I–L characteristic data dL/dI [i] is used to determine the defectiveness or non-defectiveness of the semiconductor laser 202. The value L2 is preregistered in the memory section 301 and is an optimal value determined based on the sample data obtained from defective semiconductor lasers and non-defective semiconductor lasers which are employed as the references. The waveform 803 shown in FIG. 8B shows a data extracted from the differentiated I–L characteristic data dL/dI [i] shown by the waveform 503 of FIG. 5C by the determination portion extracting section 303. The waveform 804 of the FIG. 8B shows a data extracted from the differentiated I–L characteristic data dL/dI [i] represented by the waveform 504 of FIG. 5D by the determination portion extracting section 303.

Referring to FIGS. 3 and 4 again, next, a smoothing processing section 304 executes the processing of moving averages to the differentiated I–L characteristic data dL/dI [i] (i=0, 1, ..., M) extracted by the determination portion extracting section 303 to smooth it and to remove noise from the differentiated I–L characteristic data dL/dI [i] (S106). However, means for removing noise from the differentiated I–L characteristic data dL/dI [i] are not limited to the processing of moving averages.

Then, the smoothed differentiated I–L characteristic data dL/dI [i] (i=1, 2, 3, ..., M) is converted into a secondary differentiated I–L characteristic data $d^2L/dI^2$ [i] (i=1, 2, 3, ..., M) by a secondary differentiated value calculating section 305 by differentiating the smoothed differentiated I–L characteristic data dL/dI [i] with respect to the driving current (I) (S107). The waveforms shown in FIGS. 9A to 9D show the converted secondary differentiated optical output data $d^2L/dI^2$ [i] by the secondary differentiated value calculating section 305, that is, a driving current—secondary differentiated optical output characteristic (to be referred to as a secondary differentiated I–L characteristic hereinafter). The abscissa axis indicates a driving current (I) and the ordinate axis indicates the optical output secondary differentiated value ($d^2L/dI^2$). The waveforms 901 to 904 shown in FIGS. 9A to 9D correspond to the waveforms 501 to 504 shown in FIGS. 5A to 5D, respectively.

Next, whether the noise is sufficiently removed from the secondary differentiated I–L characteristic data $d^2L/dI^2$ [i] is determined by a noise level determining section 306 (S108). When it is determined by the noise level determining section 306 that the noise is not sufficiently removed from the secondary differentiated I–L characteristic data $d^2L/dI^2$ [i], the smoothing process to the differentiated I–L characteristic data dL/dI [i] (S106) and the converting process of the differentiated I–L characteristic data dL/dI [i] into the secondary differentiated I–L characteristic data $d^2L/dI^2$ [i] (S107) are executed again. That is, the above processes S106 to S108 are repeated until it is determined by the noise level determining section 306 that the noise is sufficiently removed from the secondary differentiated I–L characteristic data $d^2L/dI^2$ [i].

The processing of the noise level determining section 306 will be described in detail with reference to FIG. 10. As shown in FIG. 10, the number of intersections between lines L3 (=LL [1]) and L4 (=LL[2]) preset as a code type level LL[n] (n=1, 2, 3, ..., JN-1) and the waveform 1001 of the secondary differentiated I–L characteristic data $d^2L/dI^2$ [i] are counted. In the example shown in FIG. 10, both lines are intersected 10 times. The code type level LL [n] is a parameter used in the next stage, i.e., the processing of a code converting section 307 and the detail will be described later. The process of counting the number of intersections of the waveform 1001 of the secondary differentiated I–L characteristic data $d^2L/dI^2$ [i] with the lines L3 and L4 indicative of the code type level is carried out once for every process of S106 and S107 (see FIG. 4). The change in the number of intersections thus obtained is recorded and the above processes of S106 to S108 are repeated until the number of intersections is converged. In other words, when the number of intersections between the both is converged, it is determined that the noise is sufficiently removed from the secondary differentiated I–L characteristic data $d^2L/dI^2$ [i]. For instance, since the number of intersections between the waveform 904 of the secondary differentiated I–L characteristic data $d^2L/dI^2$ [i] is shown in FIG. 9D and the lines L3 and L4 set as the code type level is converged to 4 times, it is determined that the noise is removed from the secondary differentiated I–L characteristic data $d^2L/dI^2$ [i] and then the processing in the next stage is carried out.

Referring to FIGS. 3 and 4 again, a code converting section 307 converts the secondary differentiated I–L characteristic data $d^2L/dI^2$ [i] from which the noise is sufficiently removed, into determination code using a preset code type level LL [n] (n=1, 2, 3, ..., JN-1) as a threshold value (S109). The determination code comprises JN types of symbols, for instance, Arabic numerals and alphabets. The code type level LL [n] is an optimal value determined based on the sample data obtained from the non-defective semiconductor lasers and the defective semiconductor lasers as the references and stored in the memory section 301 in advance.

Figure 11:
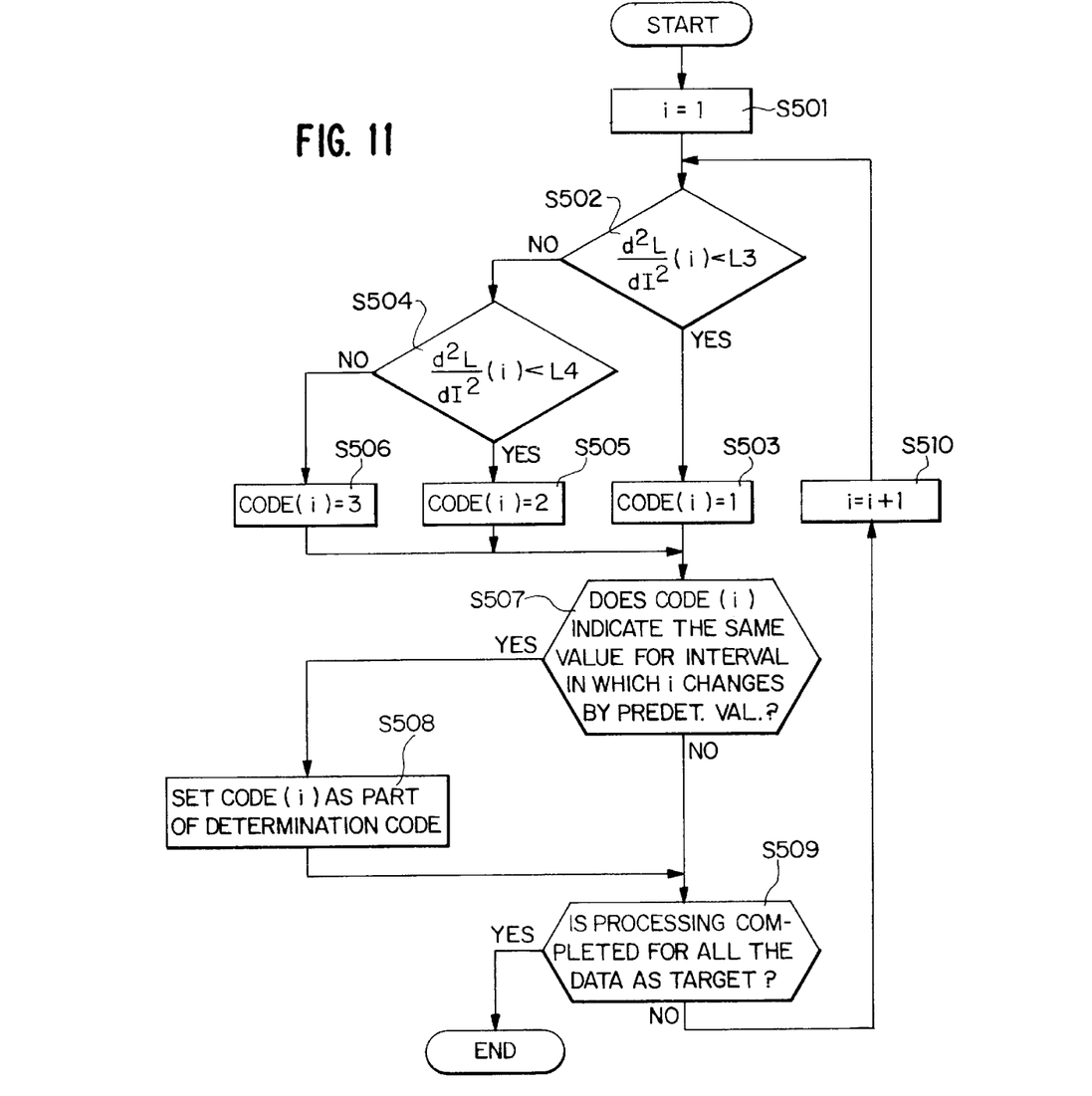
FIG. 11 is a flow chart which aids in understanding the operation of the code converting section shown in FIG. 3.

The procedure of converting the secondary differentiated I–L characteristic data $d^2L/dI^2$ [i] (i=1, 2, 3, ..., M) into the determination code will be described below in detail with reference to FIGS. 9 and 11.

First, a value i corresponding to the driving current (I) is initially set to be i=1 (S501). Then, the secondary differentiated I–L characteristic data $d^2L/dI^2$ [i] is compared with the code type level L3 (S502). If the code type level L3 is greater than the secondary differentiated I–L characteristic data $d^2L/dI^2$ [i], a value code [i] (i=1, 2, 3, ..., M) constituting the determination code is set to a value 1 (S503). On the contrary, if the code type level L3 is smaller than the secondary differentiated I–L characteristic data $d^2L/dI^2$ [i], the secondary differentiated I–L characteristic data $d^2L/dI^2$ [i] is compared with the code type level L4 (S504). If the code type level L4 is greater than the secondary differentiated I–L characteristic data $d^2L/dI^2$ [i], a value code [i] constituting the determination code is set to a value 2 (S505). On the contrary, if the code type level L4 is smaller than the secondary differentiated I–L characteristic data $d^2L/dI^2$ [i], the value code [i] constituting the determination code is set to a value 3 (S506). When the value code [i] constituting the determination code is set in the steps S503, S505, and S506, whether or not the code [i] changes for the interval during which the value i changes by a predetermined value is determined (S507). If the code [i] does not change for the predetermined interval, the value (1, 2, or 3) is set as the value constituting the determination code (S508) and then the control proceeds to a step S509. If the code [i] changes for the predetermined interval, the control proceeds to the step S509. More particularly, when the interval during which the code [i] holds the same value is short, the value is not set as the value constituting the determination code. Next, whether or not the above steps S502 to S508 are ended for all the data extracted by the determination portion extracting section 303 is determined (S509), and if so, the processing of the code converting section 307 is ended. If not, the value i is increased by one (S510) and the above steps S502 and S509 are carried out again.

When the processing of the above code converting section 307 is applied to the secondary differentiated I–L characteristic data $d^2L/dI^2$ [i] shown in FIGS. 9A to 9D, the secondary differentiated I–L characteristic data $d^2L/dI^2$ [i] of FIGS. 9A to 9D is converted into the determination codes 2-1-2, 3-2-1-2, 2-3-2, and 2-3-2-1-2, respectively.

In the above description with reference to FIGS. 9A to 9D, by setting LL [1]=L3 and LL [2]=L4 as the code type level LL [n] (n=1, 2, . . . , JN-1), the determination code comprising three (=JN) types of the value code [i] is obtained. However, the number of set code type levels LL [n] is not limited to this.

Referring to FIGS. 3 and 4 again, next, one or more defective codes which are preregistered for every type of waveform of the differentiated I–L characteristic data dL/dI [i] are searched in accordance with the type of waveform determined in the step S104 by a defective code searching section 308 (S110). The determination codes which are obtained from defective semiconductor lasers which are employed as the references in accordance with the steps S101 to S109 are registered as the defective codes in the memory section 301 in advance.

The determination code obtained by the code converting section 307 is compared with the one or more defective codes obtained by the defective code searching section 308 by a non-defectiveness or defectiveness determining section 309 (S111). The non-defectiveness or defectiveness determining section 309 determines that the semiconductor laser 202 is defective when the determination code is coincident with either one of the defective codes (S112). The non-defectiveness or defectiveness determining section 309 determines that the semiconductor laser 202 is non-defective when the determination code is not coincident with any of the defective codes (S113).

The detailed operation of the non-defectiveness or defectiveness determining section 309 will be described below for a case in which the semiconductor laser 202 having the waveform shown in FIGS. 9A to 9D is a target, and in a case in which a defective code is 3-2-1-2 when the waveform of the differentiated I–L characteristic data dL/dI [i] is the type X and a defective code is 2-3-2-1-2 when the differentiated I–L characteristic data dL/dI [i] is the type Y, the defective codes being registered in the memory section 301 in advance.

Figure 9A:
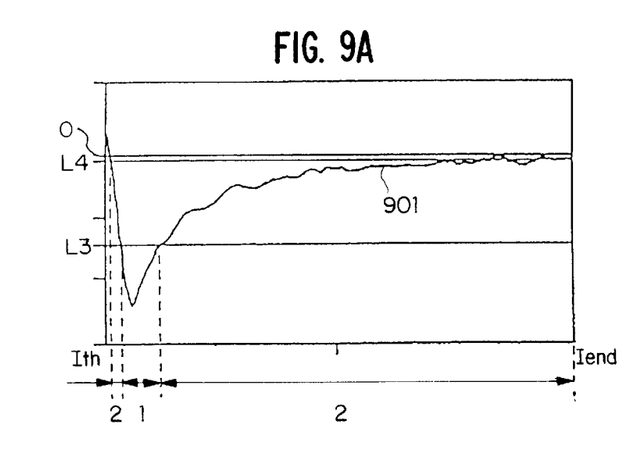
FIGS. 9A to 9D are waveform diagrams indicative of secondary differentiated I–L characteristic data calculated by the secondary differentiated value calculating section shown in FIG. 3.
Figure 9B:
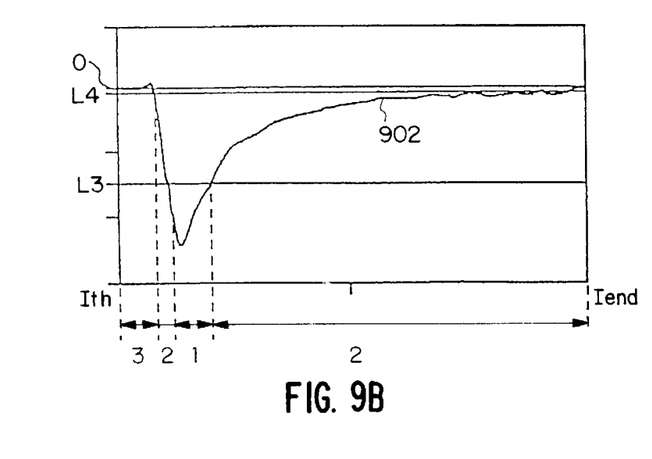
Figure 9C:
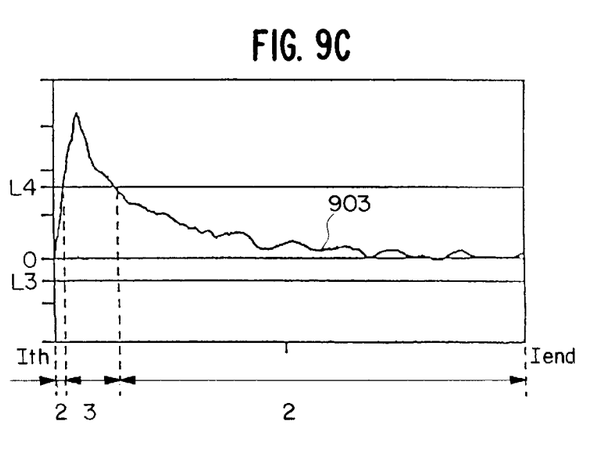
Figure 9D:
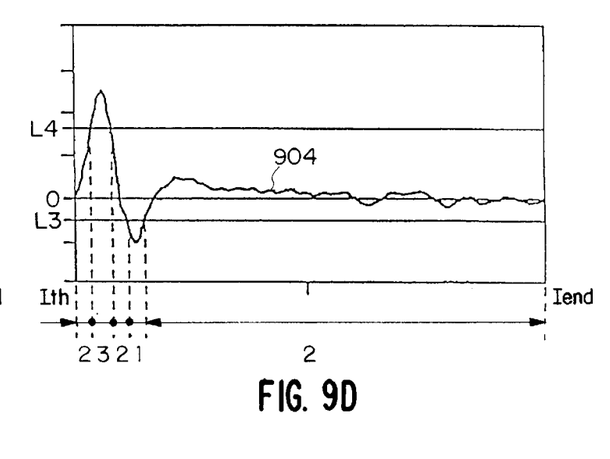
Figure 10:
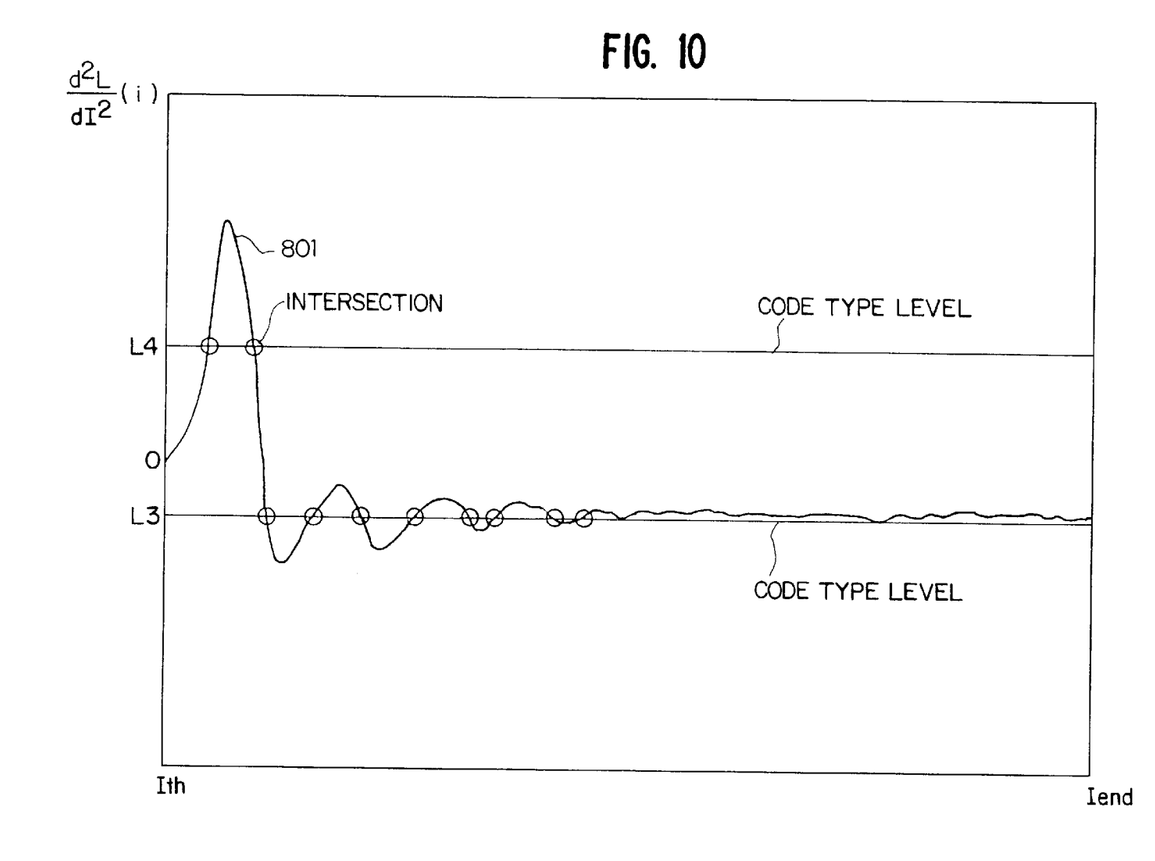
FIG. 10 is a waveform diagram which aids in understanding the operation of the noise level determining section shown in FIG. 3.

As described above, the secondary differentiated I–L characteristic data $d^2L/dI^2$ [i] of FIGS. 9A to 9D are converted into the determination codes 2-1-2, 3-2-1-2, 2-3-2, and 2-3-2-1-2 by the code converting section 307, respectively. FIGS. 9A and 9B show the waveforms of the secondary differentiated I–L characteristic data of the semiconductor lasers, the waveforms of whose differentiated I–L characteristic data dL/dI [i] are determined to be the type X by the waveform type determining section 302, and FIGS. 9C and 9D show the waveforms of the secondary differentiated I–L characteristic data of the semiconductor lasers which exhibit waveforms whose differentiated I–L characteristic data dL/dI [i] are determined to be the type Y.

The determination codes 2-1-2 (FIG. 9A) obtained by the code converting section 307 and the determination code 3-2-1-2 (FIG. 9B) are compared with the defective code 3-2-1-2 (for the waveform of the type X) stored in the memory section 301 and it is determined that the determination code obtained from the secondary differentiated I–L characteristic data of FIG. 9B is coincident with the defective code. Therefore, it is determined that the semiconductor laser 202 having the secondary differentiated I–L characteristic of FIG. 9B is defective. Similarly, when the waveform of the differentiated I–L characteristic data dL/dI [i] is of type Y, it is determined that the semiconductor laser 202 having the secondary differentiated I–L characteristic of FIG. 9D is defective. On the other hand, it is determined that the semiconductor laser 202 having the secondary differentiated I–L characteristic of FIG. 9A or the secondary differentiated I–L characteristic of FIG. 9C is non-defective, since the determination codes are not coincident with the defective codes.

It is apparent that the scope of the invention is not limited to the above-described embodiment, but encompasses the scope technically equivalent thereto.

What is claimed is:

1. A method for determining a non-defectiveness or defectiveness of a semiconductor laser comprising the steps of:

measuring an optical output from a semiconductor laser to which a driving current is supplied;

calculating a first characteristic data indicative of a differentiated optical output obtained by differentiating said optical output with respect to said driving current;

calculating a second characteristic data indicative of a secondary differentiated optical output obtained by differentiating said first characteristic data with respect to said driving current;

converting said second characteristic data into a determination code; and comparing said determination code with a preregistered code, which is obtained when said semiconductor laser is non-defective, to determine a non-defectiveness or defectiveness of said semiconductor laser.

2. A method of determining a non-defectiveness or defectiveness of a semiconductor laser as claimed in claim 1, further comprising the step of classifying said first characteristic data into one of a first data in which a waveform of said first characteristic data substantially protrudes downwards after said driving current is at least equal to a threshold current and a second data in which a waveform of said first characteristic data substantially protrudes upwards after said driving current is at least equal to a threshold current.

3. A method of determining a non-defectiveness or defectiveness of a semiconductor laser as claimed in claim 2, further comprising the step of extracting a part of said first characteristic data in accordance with a result of said classifying step.

4. A method of determining a non-defectiveness or defectiveness of a semiconductor laser as claimed in claim 2, wherein said preregistered code for determining the defectiveness or non-defectiveness of a semiconductor laser is preregistered in accordance with the classified first characteristic data.

5. A method of determining a non-defectiveness or defectiveness of a semiconductor laser as claimed in claim 1, further comprising the step of smoothing said first characteristic data to remove noise therefrom prior to the conversion of said second characteristic data into said determination code.

6. A method of determining a non-defectiveness or defectiveness of a semiconductor laser as claimed in claim 5, further comprising the steps of:

determining whether or not noise is sufficiently removed from said second characteristic data calculated based on said smoothed first characteristic data; and repeating said smoothing step and said step of converting said smoothed first characteristic data into said second characteristic data until it is determined that the noise is sufficiently removed from said second characteristic data.

7. A method of determining the non-defectiveness or defectiveness of a semiconductor laser as claimed in claim 6, wherein said step of determining whether or not noise is sufficiently removed from said second characteristic data comprises the steps of:

comparing said second characteristic data with a preset one or more first threshold values; and determining whether or not the noise is sufficiently removed from said second characteristic data, based on the comparing result.

8. A method of determining a non-defectiveness or defectiveness of a semiconductor laser as claimed in claim 7, wherein said step of converting said second characteristic data into said determination code comprises the steps of:

comparing said second characteristic data with said one or more first threshold values; and converting said second characteristic data into said determination code, based on the comparing result.

9. A method of determining a non-defectiveness or defectiveness of a semiconductor laser as claimed in claim 1, wherein said predetermination code comprises a series of numerals.

10. A method of determining a non-defectiveness or defectiveness of a semiconductor laser comprising the steps of:

measuring an optical output from a semiconductor laser while gradually increasing a driving current supplied to said semiconductor laser;

calculating a driving current—differentiated optical output data based on the measured optical output and said driving current;

A/D-converting said driving current—differentiated optical output data;

classifying said driving current—differentiated optical output data based on a waveform of said driving current—differentiated optical output data in a predetermined region which includes a region where said waveform rises abruptly;

extracting a data from said driving current—differentiated optical output data in accordance with a result of said classifying step;

smoothing said extracted driving current—differentiated optical output data to remove noise therefrom;

converting said smoothed driving current—differentiated optical output data into a driving current—secondary differentiated optical output data;

determining whether or not the noise is sufficiently removed from said driving current—secondary differentiated optical output data;

converting said driving current—secondary differentiated optical output data into a determination code after the noise is sufficiently removed from said driving current—secondary differentiated optical output data;

comparing said determination with one or more preregistered codes; and determining, based on a result of said comparing step, the defectiveness or non-defectiveness of the semiconductor laser.

11. An apparatus for determining a defectiveness or non-defectiveness of a semiconductor laser, comprising:

measuring means for measuring an optical output from a semiconductor laser to which a driving current is supplied;

first calculating means for calculating a first characteristic data obtained by differentiating said optical output with respect to said driving current;

second calculating means for calculating a second characteristic data obtained by differentiating said first characteristic data with respect to said driving current;

converting means for converting said second characteristic data into a determination code; and comparing means for comparing said determination code with a preregistered code which is obtained when a semiconductor laser is non-defective.

12. An apparatus for determining a defectiveness or non-defectiveness of a semiconductor laser as claimed in claim 11, further comprising classifying means for classifying said first characteristic data into one of a first data in which a waveform of said first characteristic data substantially protrudes downwards after said driving current is at least equal to a threshold current and a second data in which a waveform of said first characteristic data substantially protrudes upwards after said driving current is at least equal to a threshold current.

13. An apparatus for determining a defectiveness or non-defectiveness of a semiconductor laser as claimed in claim 12, further comprising extracting means for extracting a part of said first characteristic data in accordance with a result generated by said classifying means.

14. An apparatus for determining a defectiveness or non-defectiveness of a semiconductor laser as claimed in claim 12, wherein said preregistered code for determining the defectiveness or non-defectiveness of a semiconductor laser is preregistered in accordance with the classified first characteristic data.

15. An apparatus for determining a defectiveness or non-defectiveness of a semiconductor laser as claimed in claim 11, further comprising smoothing means for smoothing said first characteristic data to remove noise therefrom prior to the conversion of said second characteristic data into said determination code.

16. An apparatus for determining a defectiveness or non-defectiveness of a semiconductor laser as claimed in claim 11, further comprising noise determining means for determining whether or not noise is sufficiently removed from said second characteristic data.

17. An apparatus for determining a defectiveness or non-defectiveness of a semiconductor laser as claimed in claim 16, wherein said noise determining means comprises comparing means for comparing said second characteristic data with one or more preset first threshold values and determining means for determining whether or not the noise is sufficiently removed from said second characteristic data, based on the comparing result.

18. An apparatus for determining a defectiveness or non-defectiveness of a semiconductor laser as claimed in claim 17, wherein said converting means converts said second characteristic data into a determination code based on the comparing result.

19. An apparatus for determining a defectiveness or non-defectiveness of a semiconductor laser as claimed in claim 11, wherein said determination code comprises a series of numerals.

20. An apparatus for determining a defectiveness or non-defectiveness of a semiconductor laser, comprising:

optical output measuring means for measuring an optical output from a semiconductor laser while gradually increasing a driving current supplied to said semiconductor laser;

a first differentiating circuit for calculating a driving current—differentiated optical output data based on the measured optical output and said driving current;

an A/D-converting circuit for A/D-converting said driving current—differentiated optical output data;

a classifying circuit for classifying said driving current—differentiated optical output data based on a waveform of said driving current—differentiated optical output data in a predetermined region which includes a region where said waveform rises abruptly;

an extracting circuit for extracting a data from said driving current—differentiated optical output data in accordance with a result generated by said classifying circuit;

a smoothing circuit for smoothing said extracted driving current—differentiated optical output data to remove noise therefrom;

a second differentiating circuit for converting said smoothed driving current—differentiated optical output data into a driving current—secondary differentiated optical output data;

a noise removal determining circuit for determining whether or not the noise is sufficiently removed from said driving current—secondary differentiated optical output data;

a code converting circuit for encoding said driving current—secondary differentiated optical output data into a determination code after the noise is sufficiently removed from said driving current—secondary differentiated optical output data;

a comparing circuit for comparing said determination with one or more preregistered codes; and a defectiveness/non-defectiveness determining circuit for determining, based on a result generated by said comparing circuit, the defectiveness or non-defectiveness of the semiconductor laser.

* * * * *